(12) United States Patent
Dimitrov et al.

(10) Patent No.: US 7,763,485 B1
(45) Date of Patent: Jul. 27, 2010

(54) LASER FACET PRE-COATING ETCH FOR CONTROLLING LEAKAGE CURRENT

(75) Inventors: Roman Dimitrov, San Jose, CA (US); Ashish Verma, San Jose, CA (US); Tsurugi Sudo, San Jose, CA (US); Scott Lehmann, Oakland, CA (US)

(73) Assignee: Finisar Corporation, Sunnyvale, CA (US)

( * ) Notice: Subject to any disclaimer, the term of this patent is extended or adjusted under 35 U.S.C. 154(b) by 337 days.

(21) Appl. No.: 11/749,061

(22) Filed: May 15, 2007

Related U.S. Application Data

(60) Provisional application No. 60/747,301, filed on May 15, 2006.

(51) Int. Cl.
*H01L 21/00* (2006.01)

(52) U.S. Cl. .......... 438/42; 257/E21.119; 257/E21.131; 438/16

(58) Field of Classification Search .................... 438/42
See application file for complete search history.

(56) References Cited

U.S. PATENT DOCUMENTS

| 4,092,659 | A | 5/1978 | Ettenberg |
| 4,740,987 | A | 4/1988 | McCall et al. |
| 4,859,628 | A | 8/1989 | Knight et al. |
| 4,951,292 | A | 8/1990 | Kuindersma et al. |
| 5,208,821 | A | 5/1993 | Berger et al. |
| 5,450,432 | A | 9/1995 | Okuda |
| 5,675,601 | A | 10/1997 | Karakida et al. |
| 5,793,787 | A | 8/1998 | Meyer et al. |
| 6,219,366 | B1 | 4/2001 | Furushima |
| 6,565,403 | B1* | 5/2003 | Amey et al. ................... 445/51 |
| 6,618,410 | B1 | 9/2003 | Fischer et al. |
| 2002/0006726 | A1* | 1/2002 | Yamasaki et al. ........... 438/689 |

(Continued)

FOREIGN PATENT DOCUMENTS

JP  2000-340894  12/2000

OTHER PUBLICATIONS

Sexl, M., Bohm G., Maier, M., Tranke, G., Weimann, G., & Abstreiter, G. (1997), MBE Growth of Metamorphic In(Ga)AlAs Buffers. 1997 IEEE International Symposium on Compound Semiconductors, IEEE, 49-52.

(Continued)

*Primary Examiner*—Walter L Lindsay, Jr.
(74) *Attorney, Agent, or Firm*—Workman Nydegger

(57) ABSTRACT

A method for etching facets of a laser die prior to coating in such a way as to control the formation of oxides and metallic films on the facet is disclosed. In one embodiment, the method includes placing a wafer on which the laser is included in the interior volume of an etching chamber. Nitrogen is introduced into the interior volume to define a nitrogen-rich environment. The laser facet is then etched in the nitrogen-rich environment with argon delivered from an ion gun. In another embodiment, the method includes placing the laser in an ion beam etching chamber, then physically etching the facet of the laser with an ion beam that includes an argon/nitrogen mixture. The laser facet(s) can then be coated as desired. The etching method reduces the incidence of leakage current during operation of the laser die caused by metallic film formation on the facet before coating.

18 Claims, 5 Drawing Sheets

U.S. PATENT DOCUMENTS

| | | |
|---|---|---|
| 2002/0037024 A1 | 3/2002 | Huang |
| 2002/0114367 A1 | 8/2002 | Stintz et al. |
| 2002/0117675 A1 | 8/2002 | Mascarenhas |
| 2003/0002557 A1 | 1/2003 | Eng et al. |
| 2003/0179795 A1 | 9/2003 | Moriya et al. |
| 2004/0079967 A1 | 4/2004 | Shakuda et al. |
| 2004/0086017 A1 | 5/2004 | Yoshida et al. |
| 2004/0190835 A1 | 9/2004 | Burdick et al. |
| 2005/0031000 A1 | 2/2005 | Botez |
| 2005/0153470 A1* | 7/2005 | Lindstrom et al. ............ 438/29 |

OTHER PUBLICATIONS

Sudo, Tsurugi, et al., Semiconductor Laser Having Low Stress Passivation Layer, U.S. Appl. No. 11/749,047, filed May 15, 2007.

Ha, Yuk Lung, et al., Epitaxial Regrowth in a Distributed Feedback Laser, United States Patent Application, U.S. Appl. No. 11/749,007, filed May 15, 2007.

Verma, Ashish K., et al., Thin INP Spacer Layer in a High Speed Laser for Reduced Lateral Current Spreading, U.S. Appl. No., 11/749,033, filed May 15, 2007.

Dimitrov, Roman, et al., Method for Applying Protective Laser Facet Coatings, U.S. Appl. No. 11/749,052, filed May 15, 2007.

Dimitrov, Roman, et al., High Resistivity Engineered Laser Facet Coatings, U.S. Appl. No. 11/749,057, filed May 15, 2007.

Young, David Bruce, et al., Semiconductor Laser Having a Doped Active Layer, U.S. Appl. No. 11/749,013, filed May 15, 2007.

U.S. Appl. No. 11/749,013, mailed Oct. 29, 2008, Office Action.

U.S. Appl. No. 11/749,013, mailed Feb. 25, 2009, Notice of Allowance.

U.S. Appl. No. 11/749,047, mailed Aug. 12, 2008, Office Action.

U.S. Appl. No. 11/749,047, mailed Feb. 6, 2009, Notice of Allowance.

U.S. Appl. No. 11/749,033, mailed Jun. 2, 2008, Office Action.

U.S. Appl. No. 11/749,033, mailed Jan. 13, 2009, Notice of Allowance.

U.S. Appl. No. 11/749,007, mailed Dec. 9, 2008, Office Action.

U.S. Appl. No. 11/749,057, mailed Dec. 11, 2008, Office Action.

* cited by examiner

LASER FACET PRE-COATING ETCH FOR CONTROLLING LEAKAGE CURRENT

CROSS-REFERENCE TO RELATED APPLICATIONS

This application claims the benefit of the U.S. Provisional Patent Application No. 60/747,301, filed May 15, 2006, and entitled "LASER FACET PRE-COATING ETCH FOR CONTROLLING LEAKAGE CURRENT," which is incorporated herein by reference in its entirety.

BACKGROUND

1. Technology Field

The present invention generally relates to semiconductor optical devices. In particular, the present invention relates to a method for etching facets of a laser prior to coating in such a way as to control the formation of substances that can undesirably produce leakage current during laser operation.

2. The Related Technology

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A grating is included in either the top or bottom layer to assist in producing a coherent light beam in the active region. The coherent stream of light that is produced in the active region can be emitted through either longitudinal end, or facet, of the laser body. DFB lasers are typically known as single mode devices as they produce light signals at one of several distinct wavelengths, such as 1,310 nm or 1,550 nm. Such light signals are appropriate for use in transmitting information over great distances via an optical communications network.

The two facets of the DFB laser described above are typically coated with a coating material that optimizes the emission of light from the active region. However, during formation of the various laser layers as detailed above, certain oxides, such as aluminum oxide, indium oxide and gallium oxide, can form on the facet surface. As such, prior to coating, the facets are often subjected to an argon physical etch process to remove any oxides that have formed on the facet surfaces.

Unfortunately after the argon etch—and though the identified oxides have been removed—metallic films, such as indium, gallium, or aluminum, can remain on the facet surface, having failed to be acceptably removed by the etching process. If left in place on the facet surface and coated over, these metallic films can represent a significant source of leakage current, also referred to herein as reverse leakage, for the laser during operation. Such reverse leakage compromises the reliability of the laser and can even lead to electro-static discharge ("ESD") damage in some cases.

Therefore, a need exists in the art for a method of removing metallic films from the facet surfaces of a laser, such as a distributed feedback, Fabry-Perot, or other laser, prior to facet coating so as to improve device reliability and performance.

BRIEF SUMMARY

The present invention has been developed in response to the above and other needs in the art. Briefly summarized, embodiments of the present invention are directed to a method for etching facets of a laser die prior to coating in such a way as to control the formation of oxides and metallic films on the facet.

In one embodiment, the method includes placing a wafer on which the laser is included in the interior volume of an etching chamber. Nitrogen is introduced into the interior volume to define a nitrogen-rich environment. The laser facet is then etched in the nitrogen-rich environment with argon delivered from an ion gun.

In another embodiment, the method includes placing the laser in an ion beam etching chamber, then physically etching the facet of the laser with an ion beam that includes an argon/nitrogen mixture. The laser facet(s) can then be coated as desired. The etching method reduces the incidence of leakage current during operation of the laser die caused by metallic film formation on the facet before coating.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which are generally directed to a method for etching facets of a laser prior to coating in such a way as to control the formation of substances that can undesirably produce leakage current during laser operation.

Note at the outset that the discussion to follow regarding embodiments of the present invention should not be construed as limiting the application to such embodiments. Indeed, devices and components apart from optical transmitters and transceiver modules that employ laser devices and other suitable light sources can also benefit from the teachings to be discussed herein. Moreover, the principles of the present invention can apply to lasers of various types and configurations, including DFB, FP, and other lasers.

1. Exemplary Operating Environment

Figure 1:
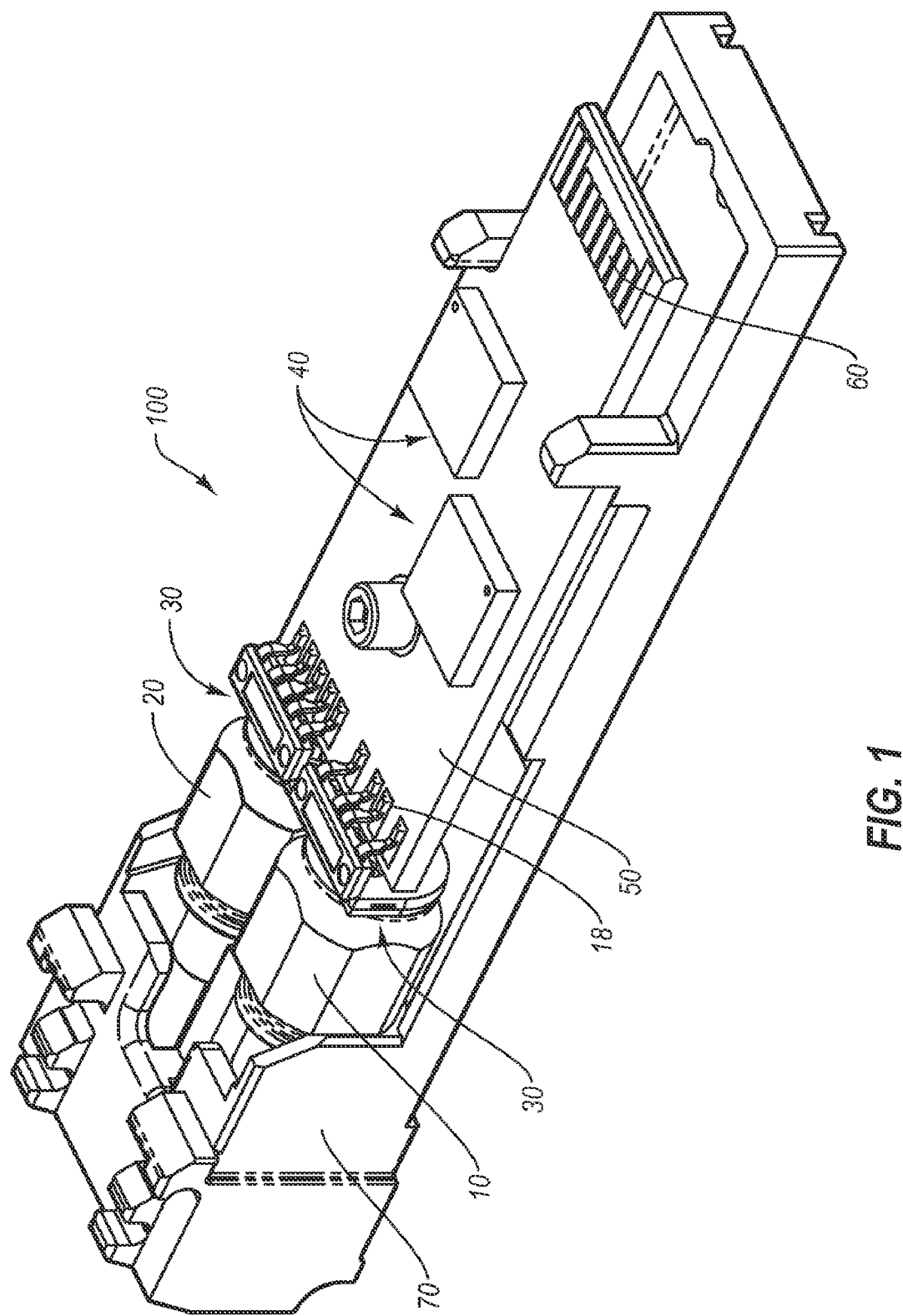
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

2. Aspects of Engineered Laser Facet Coatings

Figure 2:
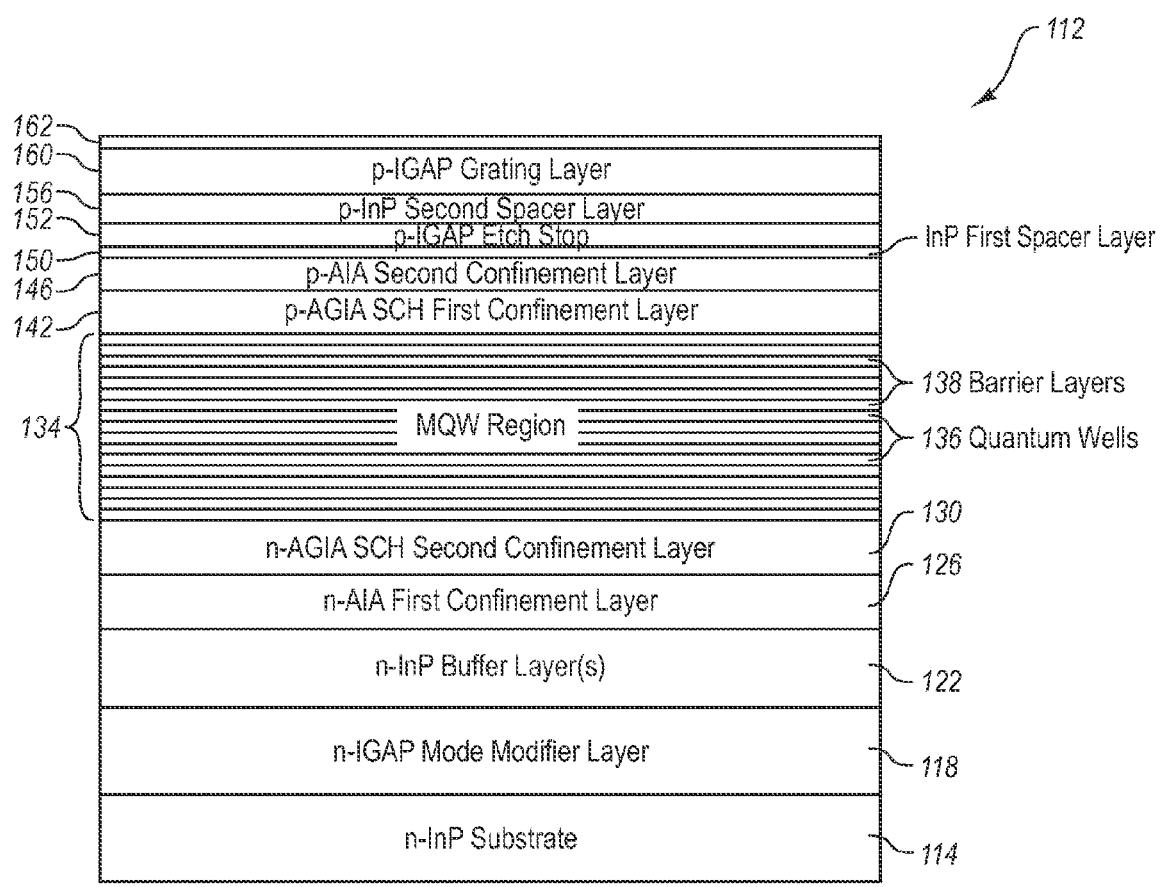
FIG. 2 is a cross sectional side view of an epitaxial base portion of a distributed feedback ("DFB") laser, according to one embodiment of the present invention.
Figure 3:
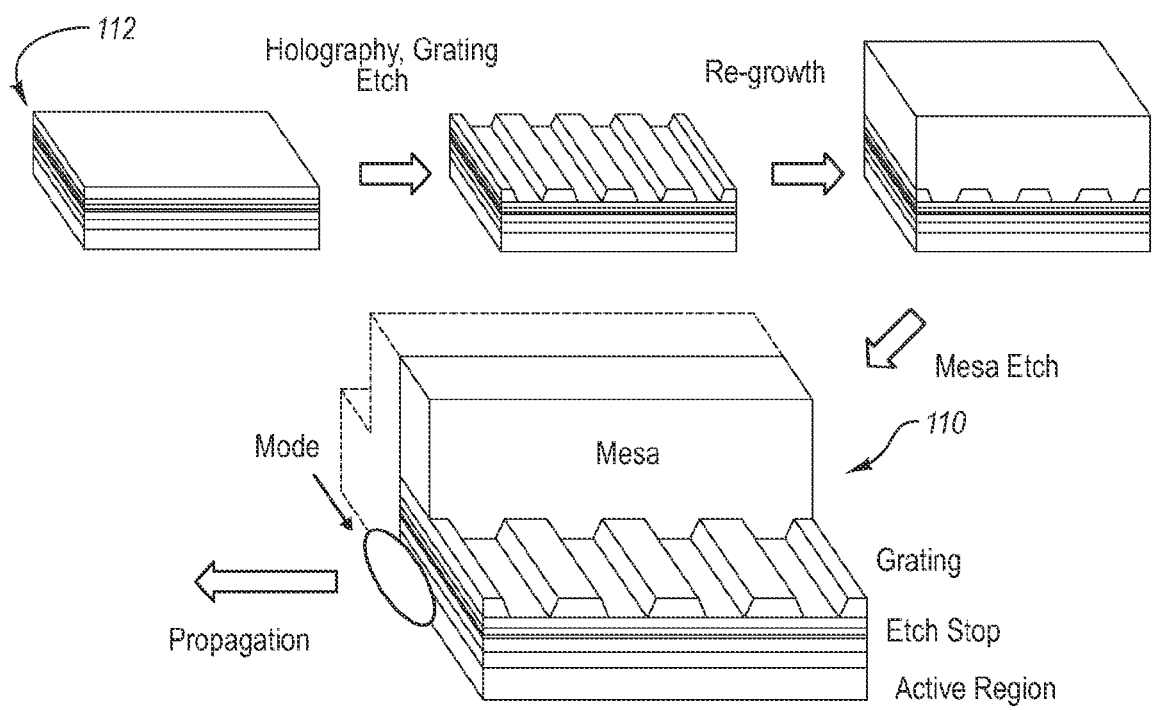
FIG. 3 is a progressive view of various processing and manufacturing stages performed on the epitaxial base portion of a laser, as shown in FIG. 2.

Together with FIG. 1, reference is now made to FIGS. 2 and 3. In general, the operating environment described above, including the transceiver 100 and TOSA 20, is exemplary of one environment in which a laser device produced in part according to principles of the present invention can be employed. In particular, embodiments of the present invention disclose methods for etching facets of a laser, such as a distributed dieback or Fabry-Perot laser, prior to coating in such a way as to control the formation of substances that can undesirably produce leakage current during laser operation.

As already mentioned, a distributed feedback ("DFB") laser is one example of a semiconductor optical device benefiting from practice of embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way.

a. Base Epitaxial Layers

FIG. 2 illustrates layers of a base epitaxial portion 112 of a 10 G DFB laser, generally designated at 110 in FIG. 3, at a stage prior to etching of the grating layers. The base epitaxial portion 112 of the DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. The mode modifier layer 118 functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 μm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-MA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated," which means that the barriers 138 are designed to have opposing strain characteristics relative to the strain characteristics of the quantum wells 136. As a result, the strain generated from the barriers 138 at least partially cancels the strain generated by the quantum wells 136 and reduces the overall strain on the MQW region 134. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode 110 always occurs in the same place, and is not made variable by unpredictable dopant diffusion processes. Further details regarding the doping of the MQW region 134 will be given further below.

A first p-confinement layer 142 of Aluminum Gallium Indium Arsenide (p-AGIA SCH) is grown on the active region at a thickness of 30 nm and is doped with zinc. A second p-confinement layer 146 of Aluminum Indium Arsenide (p-MA) is grown at a thickness of 20 nm on the p-AGIA SCH layer and is also doped with zinc. Both of the p-layers are confinement layers and effectively maintain holes within the active region so that photons are produced. The p-AGIA SCH first confinement layer 142 is graded to improve the confinement characteristics of the layer. The thicknesses of these p-layers were designed to be thin in order to optimize the speed and thermal performance of the laser.

A first spacer layer 150 is located above the p-confinement layers 142 and 146. The first spacer layer 150 is made of Indium Phosphide and is approximately 5 nm in thickness. The thinness of the first spacer layer 150 improves the coupling efficiency of the grating and improves the speed of the laser 110. In particular, the first spacer layer 150 effectively controls the degree to which lateral current spreading occurs between the bottom of the ridge mesa and the active region 134.

Various "above-active" grating layers are located above the first spacer layer 150. An etch stop layer (p-IGAP) 152 made of Indium Gallium Arsenide Phosphide and, having a thickness of 15 nm, is grown on the spacer layer 150. The etch stop layer 152 is provided for stopping the mesa etch.

A second spacer layer 156 is provided to separate the etch stop layer 152 and a grating layer, described below. In the illustrated design, a grating etch procedure is timed to stop within the second spacer layer 156. The second spacer layer 156 layer is made of Indium Phosphide (p-InP) at a thickness of 25 nm.

A grating layer (p-IGAP) 160 is grown on the second spacer layer 156 and is made of Indium Gallium Arsenide Phosphide at a thickness of 30 nm. The grating layer 160 is "above active" (as compared to other possible designs in which the grating is below the active region). Laser holography, wet etching, and subsequent InP regrowth, as explained further below, are used to create a uniform grating in the grating layer 160, consisting of alternating layers of high index IGAP and low index InP down a length of the laser cavity.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed. The top layer 162 is a thin layer of Indium Phosphide.

b. Grating Fabrication and Regrowth

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth steps in forming the DFB laser 110. As described above and by way of brief overview, a wet etch is performed to etch periodic gaps within the grating layer, as shown in FIG. 3. After the etch is completed and the grating teeth are created, thick Indium Phosphide is grown ("regrowth") on the etched, base epitaxial structure, in order to fill the gaps with low-index InP and also to form the mesa layer, also shown in FIG. 3. The regrowth is completed with an Indium Gallium Arsenide layer for electrical contact.

As mentioned above, the Indium Phosphide regrowth is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth, thereby defining the mesa of the DFB laser. Both dry and wet etching can be used in creating the mesa ridges.

After the etching process is complete, a dielectric layer (not explicitly shown) is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa. In other embodiments, a single layer of Silicon Nitride or Silicon Oxide can be employed for the dielectric layer.

The dielectric layer is removed from the top of the mesa to allow an electrical contact and metallic layer (not shown) to be placed on the mesa. Electrical contact is made by depositing metal onto the Indium Gallium Arsenide layer at the top of the mesa. This contact is both a non-alloy contact and a low penetration contact.

A metallic layer (not shown) is placed on the electrical contact to which electrical current may be provided to the laser structure. In the present embodiment, the metallic layer is made of three sub-layers of titanium, platinum and gold. The titanium sun-layer is placed directly on the electrical contact layer, then the platinum sub-layer and gold sub-layer are applied. This metallic layer provides sufficient conductivity to the Indium Gallium Arsenide layer so that current can be properly provided to the laser structure.

Bottom electrical contacts are generated by thinning the InP substrate and placing an n-type metallic layer (not shown) on the bottom.

A DFB laser is removed from a wafer using common techniques by cleaving and breaking the wafer both horizontally and laterally to separate each laser. After this process, anti-reflective ("AR") and high-reflective ("HR") coating processes are performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which optically couples with an optical fiber. A minority of the optical power is emitted from the back of the laser, which may couple with a photodetector (not shown) that is used to monitor laser performance.

In one embodiment, the AR and HR coatings are made of layers of Silicon Oxide and Silicon. The reflectivity of the AR coating is designed to be less than about 0.5%, while the HR coating is designed to be higher than about 90%. Once the coating process is complete, a testing process is performed in which the power characteristics and optical spectrum are tested.

The DFB laser 110 and photodetector are packaged into an optical sub-assembly, such as the TOSA 20 shown in FIG. 1, which is subsequently packaged into an optical module, e.g., the transceiver 100 of FIG. 1, along with driver and control integrated circuits.

c. Laser Facet Protection

Figure 4:
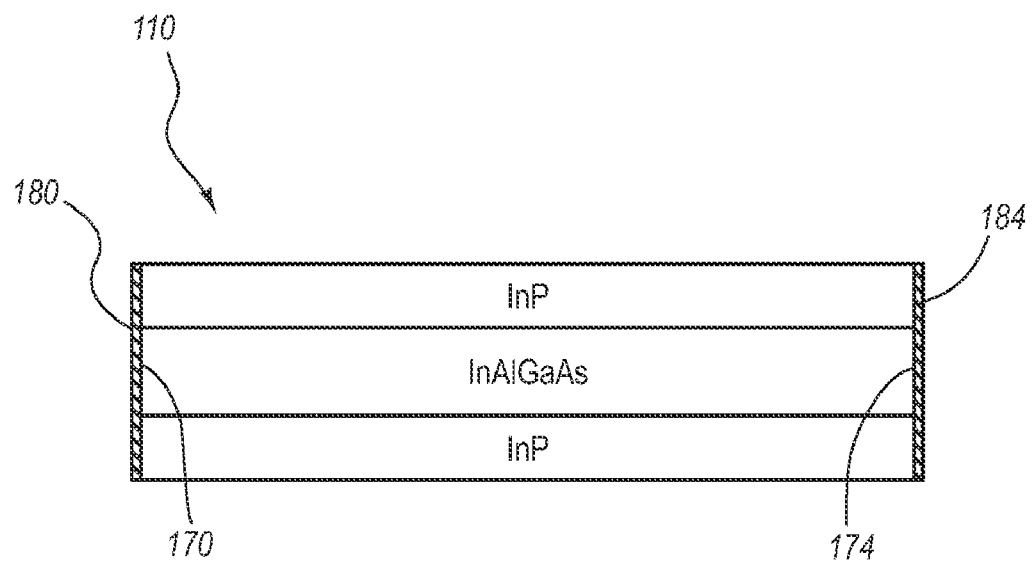
FIG. 4 is a cross sectional side view of a laser similar to that shown in FIG. 3, showing facets and facet coatings configured according to one embodiment of the present invention.

Together with FIGS. 2 and 3, reference is now made to FIG. 4, which depicts a laser, such as the laser 110 discussed above, having coated facets, in accordance with one embodiment. In particular, the laser 110 includes a front facet 170 and a rear facet 174. As shown, the front facet 170 includes a coating 180 deposited thereon. Similarly, the rear facet 174 includes a coating 184 deposited thereon. As described above, the coatings 180 and 184, e.g., AR and HR coatings, are employed to impart certain reflectivity characteristics to the facets 170 and 174, respectively. The coatings may be the same or different, according to the particular characteristics desired.

FIG. 4 also shows in cross section selected layers of the laser 110, particularly layers included in the epitaxial base portion thereof. In particular, the middle layer shown is representative of one of the second n-confinement layer 130 and the first p-confinement layer 142 having an InAlGaAs composition. Outer layers, representing for example the buffer layer 122 and second spacer layer 156 having an InP composition are also shown. Note that the layers shown in FIG. 4 represent just a few of the several layers that collectively form the epitaxial base portion 112 shown in FIG. 2. Thus, FIG. 4 depicts only certain layers for purposes of clarity in describing embodiments of the present invention. Indeed, the layers explicitly shown in FIG. 4 can be layers other than those described above having varying compositions. Thus, the depiction in FIG. 4 and the accompanying description to follow should not be construed as limiting the present invention any way.

Note that the lateral layers of the laser shown in 110 include various metallic components, including indium, aluminum, and gallium. As described earlier, such metallic components can undesirably leave a film on the surfaces of the facets 170 and 174 after typical etching procedures are performed, which can lead to reverse leakage of the laser during operation. In particular, laser layer compositions including InGaAlAs and InGaAsP are especially susceptible to such metallic film formation. Specifically, indium is particularly apt to form such metallic films on surfaces of the facets 170 and 174 as a result of traditional etching. Note, however, that embodiments of the present invention can be applied to treating facets of a laser having layers that include various metallic constituents, and not just those layers including indium, gallium, or aluminum.

In accordance with one embodiment, a particular method and etch chemistry are followed in physically etching the facets 170 and 174 prior to coating with the coatings 180 and 184, respectively, in such a way as to reduce or eliminate the presence of metallic films on the facet surfaces. Specifically, an etching composition including a combination of argon and nitrogen gases is effective at acceptably cleaning laser facets surfaces of oxides while at the same time removing or acceptably reducing the presence of metallic films normally remaining after traditional physical etching with argon gas only is performed.

In one embodiment, the argon/nitrogen mixture is gaseous and mixed to a concentration of approximately 12 standard cubic centimeters per minute ("sccm") of argon, and 25 to 30 sccm of nitrogen. Note, however, that other relative argon/nitrogen mixture concentrations can also be employed; indeed, it is believed that substantial variation in the argon/nitrogen mixture can be tolerated while still acceptably cleaning the facet surfaces. As such, concentrations that vary from what is described herein are contemplated as part of the present invention. However, a minimum amount of nitrogen in the mixture is required, i.e., there should be at least as much nitrogen in the mixture as there is argon.

In one embodiment, removal of metallic films from the surfaces of the facets 170 and 174 is performed through an ion beam physical etching procedure employing the argon/nitrogen mixture discussed above. So configured, an argon/nitrogen ion beam etching process etches away oxides that have formed on the surfaces of the facets 170 and 174 during epitaxial deposition and subsequent processes.

Figure 6:
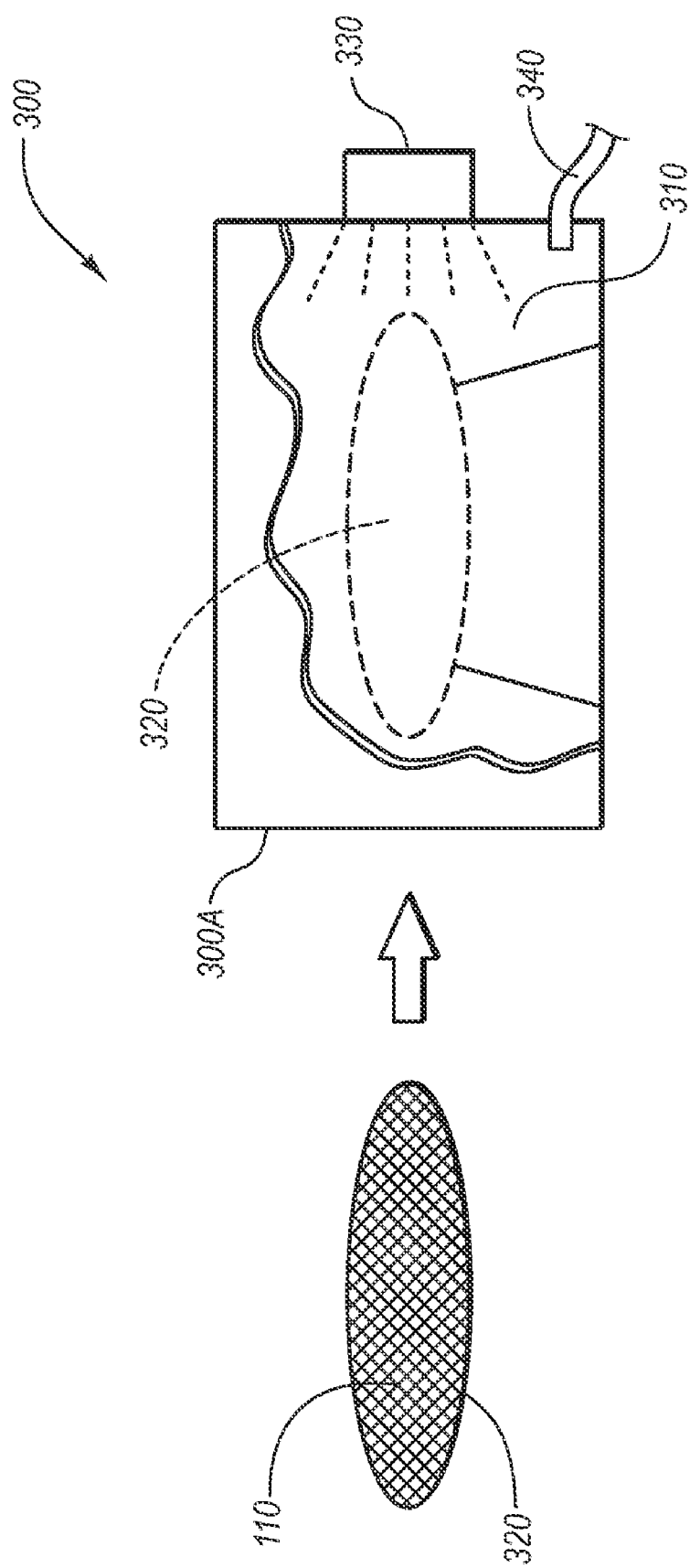
FIG. 6 is a simplified side view of an etching chamber utilized in accordance with one embodiment of the present invention.

The above physical etching procedure in one embodiment is carried out in an etching chamber as part of an ion beam etching process. A simplified view of such an etching chamber is depicted at 300 in FIG. 6. The coating chamber 300 includes a door 300A and an interior volume 310 where a wafer 320 containing a plurality of laser dies 110, is positioned during coating. An ion gun 330 is positioned so as to provide an ion beam to the interior volume 310 during the etching process. An inlet 340 is also included and is in communication with the interior volume 310 for selectively introducing gas(es) therein. Note that the etching system shown in FIG. 6 is exemplary only, and can vary from what is described herein.

Note that the argon/nitrogen mixture can be input into the ion beam etching chamber 300 through the ion gun 330 in an active process that causes the nitrogen in the argon/nitrogen mixture to split from its molecular form (N2) to an atomic, or ionic form (N+). In another possible implementation, only the argon gas is input through the ion gun 330, while the nitrogen is added in a passive process through the inlet 340 to form a nitrogen-rich environment in the interior volume 310. In this latter case, the nitrogen remains in molecular form (N2) and the argon/nitrogen mixture for etching is formed in the chamber once both elements are introduced therein.

As the etching proceeds with one of the argon/nitrogen mixture configurations described above, portions of the semiconductor device adjacent the facets 170 and 174 are exposed, which allows metal from within the device to migrate to the facet surface. The argon/nitrogen ion beam etching chemistry, however, removes those films to the point that reverse leakage potential is alleviated in the final laser device. Thus, in one example scenario where a metallic indium film forms on the facet surface, it is immediately removed by the argon/nitrogen physical etching process, thereby preserving the integrity of the facet surface for subsequent coating processes, such as to apply reflective coatings to the facets 170 and 174. Note that this metallic film removal is operative for other metals that may be included in layers of the laser 110 as well.

Figure 5:
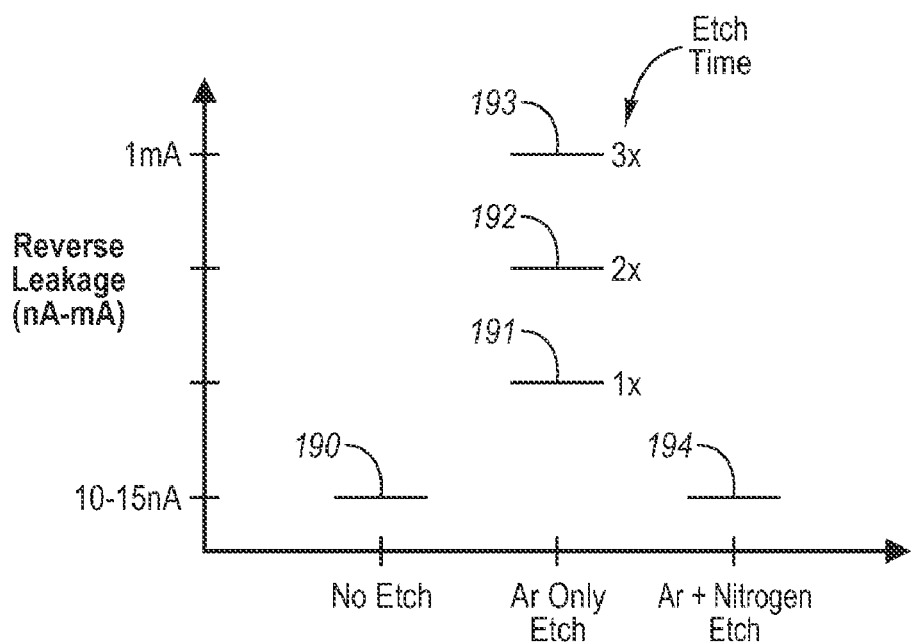
FIG. 5 is a graph showing various details regarding results achieved as a result of practice of one embodiment of the present invention.

Reference is now made to FIG. 5, which shows a graph depicting leakage characteristics for a laser according to different facet physical etching procedures. In particular, the x-axis of the graph shows three possible etching scenarios: no etching, an argon-only etch, and an argon-nitrogen etch according to one embodiment of the present invention. The y-axis shows corresponding levels of reverse leakage possible with the three etching scenarios shown on the x-axis.

As shown in FIG. 5, when no etch is performed, reverse leakage is measured at a particular level, as shown by the level 190. Note that no etching will allow oxides to remain on the facet surface, which can result in deleterious effects for the laser after the facet coatings are applied. When an argon-only etch is performed for a first time period, a level of reverse leakage 191 is realized. Should the argon-only etching continue one to a second or third time period, the amount of reverse leakage actually increases to levels 192 and 193, respectively, indicating an increasing accumulation of metallic film on the facet surface. Thus, the reverse leakage condition is worsened as a result of further argon-only etching.

In contrast, etching performed with an argon/nitrogen mixture removes oxides from the facet while minimizing metallic film accumulation on the facet surface, as shown by level 194. Indeed the level of metallic film accumulation after the argon/nitrogen etch is comparable to the level 190 where no etch was performed. Thus, use of the argon nitrogen etch enables both oxides and metallic films to be controlled on the facet surface in preparation for coating.

As a result of practice of the above method, conductive material accumulation on the facet is controlled, thereby controlling reverse leakage during laser operation. This in turn improves device reliability and reduces the chances for ESD-related damage. Note that, in other embodiments, other noble (inert) gases can be used in place of argon, such as helium, for example.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A method for etching a facet of a laser die, the method comprising:
   etching the facet utilizing a mixture of a noble gas and nitrogen, wherein the facet is etched utilizing a mixture of a noble gas and nitrogen so as to remove an oxide from a surface of the facet while preventing formation of a metallic film on the facet.

2. The method for etching as defined in claim 1, wherein the noble gas is argon.

3. The method for etching as defined in claim 1, wherein etching the facet further comprises:
   etching the facet utilizing an ion beam.

4. The method for etching as defined in claim 2, wherein the laser die is included on a wafer positioned in an interior volume of an etching chamber, and wherein etching the facet further comprises:
   passing the argon through an ion gun.

5. The method for etching as defined in claim 4, wherein the etching the facet further comprises:
   passing the nitrogen intermixed with the argon through the ion gun.

6. The method for etching as defined in claim 1, wherein the laser die is a distributed feedback laser.

7. A method for etching a facet of a laser die, the laser die included on a wafer, the method comprising:
   placing the wafer in an interior volume of an etching chamber;
   introducing nitrogen into the interior volume to define a nitrogen-rich environment; and
   etching the facet in the nitrogen-rich environment with argon delivered from an ion gun.

8. The method for etching as defined in claim 7, wherein introducing nitrogen further comprises:
   introducing molecular nitrogen into the interior volume.

9. The method for etching as defined in claim 8, wherein introducing nitrogen further comprises:
   introducing the nitrogen into the interior volume via an inlet defined in the etching chamber.

10. The method for etching as defined in claim 7, wherein etching the facet removes oxide and metallic material from the facet.

11. A method for preparing a facet of a distributed feedback laser for coating, the method comprising:
    placing the laser in an ion beam etching chamber; and
    physically etching the facet of the laser with an ion beam, the ion beam including argon and nitrogen, wherein the facet of the laser is etched with the ion beam including argon and nitrogen so as to remove an oxide from a surface of the facet while preventing formation of a metallic film on the facet.

12. The method for preparing as defined in claim 11, wherein the ion beam is composed of:
    approximately 12 sccm of argon; and
    approximately at least 25 sccm of nitrogen.

13. The method for preparing as defined in claim 12, wherein physically etching further comprises:
    physically etching the facet of the laser with an ion beam, the ion beam including argon and nitrogen, the ion beam being ejected from an ion gun.

14. The method for preparing as defined in claim 13, wherein the nitrogen is in ionic form when ejected from the ion gun.

15. The method for preparing as defined in claim 14, wherein the ion beam is composed of a concentration of approximately 30 sccm of nitrogen.

16. The method for preparing as defined in claim 15, wherein the physical etch controls reverse leakage of the laser.

17. The method for preparing as defined in claim 16, wherein the physical etch controls electrostatic discharge of the laser.

18. The method for etching as defined in claim 1, wherein the metallic film that is prevented from forming is one of an indium metallic film, a gallium metallic film, an aluminum metallic film, or a combination thereof.

* * * * *